United States Patent
Blanchflower et al.

(10) Patent No.: US 11,995,039 B2
(45) Date of Patent: May 28, 2024

(54) PARTIAL DECOMPRESSION FOR RAPID FILE OR SUB-FILE ACCESS

(71) Applicant: LONGSAND LIMITED, Cambridge (GB)

(72) Inventors: Sean Blanchflower, Cambridge (GB); Brian Cowe, Cambridge (GB); Barnaby Wainwright, Cambridge (GB)

(73) Assignee: LONGSAND LIMITED (GB)

( * ) Notice: Subject to any disclaimer, the term of this patent is extended or adjusted under 35 U.S.C. 154(b) by 154 days.

(21) Appl. No.: 17/315,676

(22) Filed: May 10, 2021

(65) Prior Publication Data
US 2022/0358094 A1 Nov. 10, 2022

(51) Int. Cl.
| G06F 16/00 | (2019.01) |
| G06F 16/174 | (2019.01) |
| H03M 7/30 | (2006.01) |
| H03M 7/40 | (2006.01) |

(52) U.S. Cl.
CPC ...... *G06F 16/1744* (2019.01); *H03M 7/3088* (2013.01); *H03M 7/40* (2013.01)

(58) Field of Classification Search
None
See application file for complete search history.

(56) References Cited

U.S. PATENT DOCUMENTS

2020/0272336 A1* 8/2020 Gomes ............... G06F 3/061

FOREIGN PATENT DOCUMENTS

EP 0660587 A2 * 7/1994

OTHER PUBLICATIONS

Zhang Hao. Sep. 2018. MALDC: a Depth Detection Method for Malware Based on Behavior Chains.*

* cited by examiner

*Primary Examiner* — Tuankhanh D Phan
(74) *Attorney, Agent, or Firm* — Sheridan Ross P.C.

(57) ABSTRACT

Embodiments of the present disclosure provide systems and methods for reverse decompression. According to one embodiment of the present disclosure, the method for reverse decompression includes receiving encoded and compressed input data in a form of one or more data blocks and locating an end of block marker for a last block of the one or more data blocks of the input data. The method also includes traversing the input data, bit by bit, in a reverse direction starting from a last bit of the end of block marker of the last block of the one or more data blocks of the input data towards a beginning of the input data, determining if one block of the one or more blocks of the input data can be designated as a valid block, designating the one block as a valid block and decompressing the valid block in a forward direction.

20 Claims, 8 Drawing Sheets

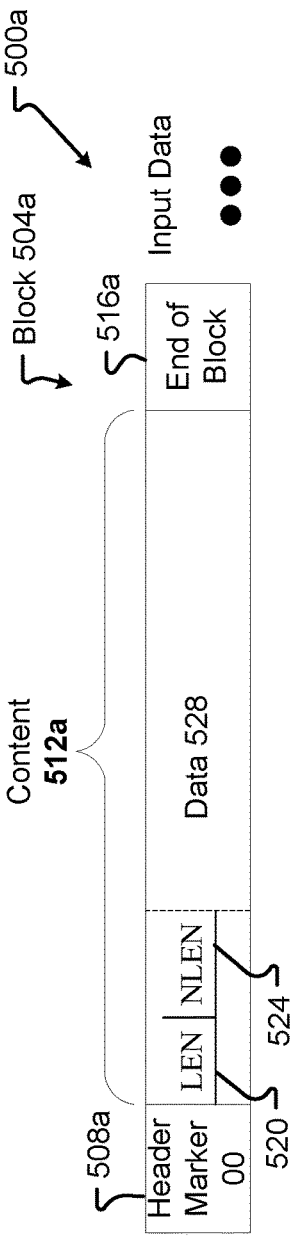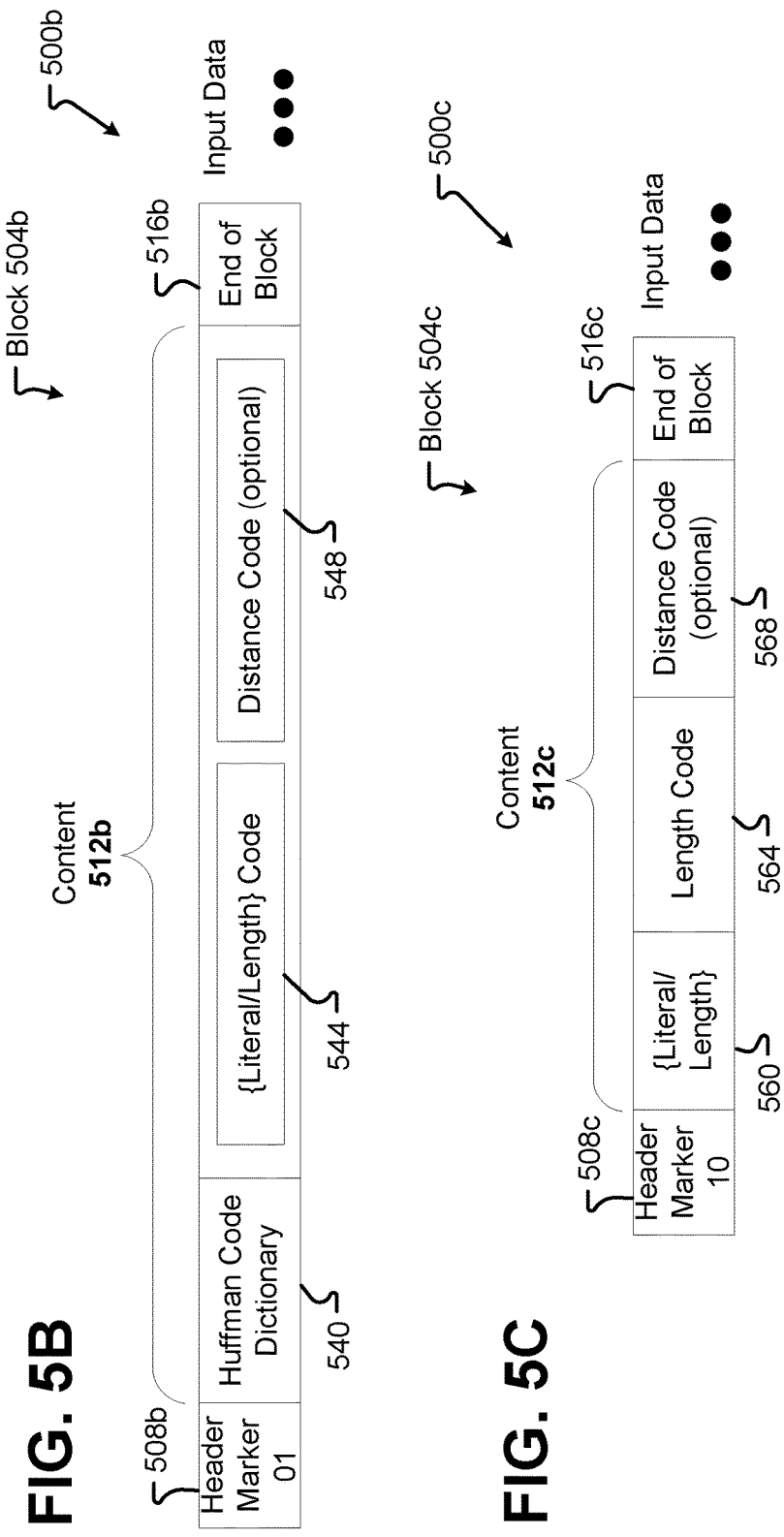
FIG. 5A
FIG. 5B
FIG. 5C

PARTIAL DECOMPRESSION FOR RAPID FILE OR SUB-FILE ACCESS

FIELD OF THE DISCLOSURE

Embodiments of the present disclosure relate generally to methods and systems for decompression of files or sub-files and more particularly to methods and systems for partial decompression of files or sub-files using reverse decompression for rapid file access.

BACKGROUND

Data compression is used in processor-based systems to reduce the size of data. Reducing the size of data can reduce memory needs to store a given amount of data as well as reduce the amount of data transfer bandwidth needed for reading data from and writing data to memory. In the field of compression and decompression, the Lempel-Ziv (LZ)-based compression and decompression algorithms are known. LZ-based compression algorithms are lossless data compression techniques that allow the original data to be perfectly reconstructed from the compressed data.

LZ based compression and decompression algorithms use techniques such as backreferences to a dictionary, which is defined by a moving window, as well as an inbuilt dictionary, and literal strings. A compressed file of input data using an LZ-based compression algorithm contains a series of blocks with each block beginning with a block type marker (e.g., a header which contains 2 bits), followed by the content and then an end-of-block marker. The content is formed using one of the three above-identified techniques. For example, when the content is a literal string, the content includes length information and data information. When the content is a backreference to a dictionary or an inbuilt dictionary, reference is made to that dictionary.

During LZ-based decompression, each block is decompressed sequentially and relies on the previously decompressed blocks to provide the moving window dictionary to decompress the remainder of the data. This decompression method has drawbacks in that it requires an entire file to be read which is inefficient when not all of the information from the file is required to perform a particular task. Thus, there is a need for evaluating data in a reverse manner to reduce the total amount of data decompressed when all of the data is not required to complete a task.

BRIEF SUMMARY

Embodiments of the present disclosure provide systems and methods for reverse decompression. According to one embodiment of the present disclosure, the method for reverse decompression includes receiving encoded and compressed input data in a form of one or more data blocks and locating an end of block marker for a last block of the one or more data blocks of the input data. The method also includes traversing the input data, bit by bit, in a reverse direction starting from a last bit of the end of block marker of the last block of the one or more data blocks of the input data towards a beginning of the input data, determining if one block of the one or more blocks of the input data can be designated as a valid block, designating the one block as a valid block and decompressing the valid block in a forward direction.

The method also includes determining, by the processor, that a maximum data block length has been reached after traversing, bit by bit, at least one of the one or more data blocks of the input data, determining, by the processor, if there is at least one prior designated valid block and if there is at least one prior designated valid block, changing, by the processor, a designation about a previous block being a valid block. The previous block is provided before the at least one prior designated valid block in the forward direction.

The method further includes determining, by the processor, that a maximum data block length has been reached after traversing the input data bit by bit, determining, by the processor, if there is at least one prior designated valid block and if there is not at least one prior designated valid block, terminating, by the processor, the method for reverse decompression.

Additionally, if one block of the one or more blocks of the input data cannot be designated as a valid block, the processor continues to traverse the input data, bit by bit, in the reverse direction towards the beginning of the input data. The one or more data blocks includes a literal string, a static dictionary for decompressing data compressed using static Huffman tables and/or a dynamic dictionary for decompressing data compressed using dynamic Huffman tables. Moreover, the reverse decompression is operative in accordance with a Lempel-Ziv type algorithm.

According to another embodiment, a system can comprise a processor and a memory coupled with and readable by the processor. The memory can store therein a set of instructions which, when executed by the processor, causes the processor to reverse decompress encoded and compressed input data by receiving encoded and compressed input data in a form of one or more data blocks, locating an end of block marker for a last block of the one or more data blocks of the input data, traversing the input data, bit by bit, in a reverse direction starting from a last bit of the end of block marker of the last block of the one or more data blocks of the input data towards a beginning of the input data, determining if one block of the one or more blocks of the input data can be designated as a valid block, designating the one block as a valid block and decompressing the valid block in a forward direction.

The system also includes determining, by the processor, that a maximum data block length has been reached after traversing, bit by bit, at least one of the one or more data blocks of the input data, determining, by the processor, if there is at least one prior designated valid block and if there is at least one prior designated valid block, changing, by the processor, a designation about a previous block being a valid block. The previous block is provided before the at least one prior designated valid block in the forward direction.

The system further includes determining, by the processor, that a maximum data block length has been reached after traversing the input data bit by bit, determining, by the processor, if there is at least one prior designated valid block and if there is not at least one prior designated valid block, terminating, by the processor, the method for reverse decompression.

Additionally, if one block of the one or more blocks of the input data cannot be designated as a valid block, the processor continues to traverse the input data, bit by bit, in the reverse direction towards the beginning of the input data. The one or more data blocks includes a literal string, a static dictionary for decompressing data compressed using static Huffman tables and/or a dynamic dictionary for decompressing data compressed using dynamic Huffman tables. Moreover, the reverse decompression is operative in accordance with a Lempel-Ziv type algorithm.

According to yet another embodiment, a non-transitory, computer-readable medium can comprise a set of instructions stored therein which, when executed by a processor, causes the processor to reverse decompress an encoded and compressed input data by receiving encoded and compressed input data in a form of one or more data blocks, locating an end of block marker for a last block of the one or more data blocks of the input data, traversing the input data, bit by bit, in a reverse direction starting from a last bit of the end of block marker of the last block of the one or more data blocks of the input data towards a beginning of the input data, determining if one block of the one or more blocks of the input data can be designated as a valid block, designating the one block as a valid block and decompressing the valid block in a forward direction.

The non-transitory computer-readable medium when executed by the processor also includes determining, by the processor, that a maximum data block length has been reached after traversing, bit by bit, at least one of the one or more data blocks of the input data, determining, by the processor, if there is at least one prior designated valid block and if there is at least one prior designated valid block, changing, by the processor, a designation about a previous block being a valid block. The previous block is provided before the at least one prior designated valid block in the forward direction.

The non-transitory computer-readable medium when executed by the processor further includes determining, by the processor, that a maximum data Hock length has been reached after traversing the input data bit by bit, determining, by the processor, if there is at least one prior designated valid block and if there is not at least one prior designated valid block, terminating, by the processor, the method for reverse decompression.

Additionally, if one block of the one or more blocks of the input data cannot be designated as a valid block, the processor continues to traverse the input data, bit by bit, in the reverse direction towards the beginning of the input data.

BRIEF DESCRIPTION OF THE DRAWINGS

FIGS. 5A-5C are block diagrams illustrating input data according to embodiments of the present disclosure.

Figure 1:
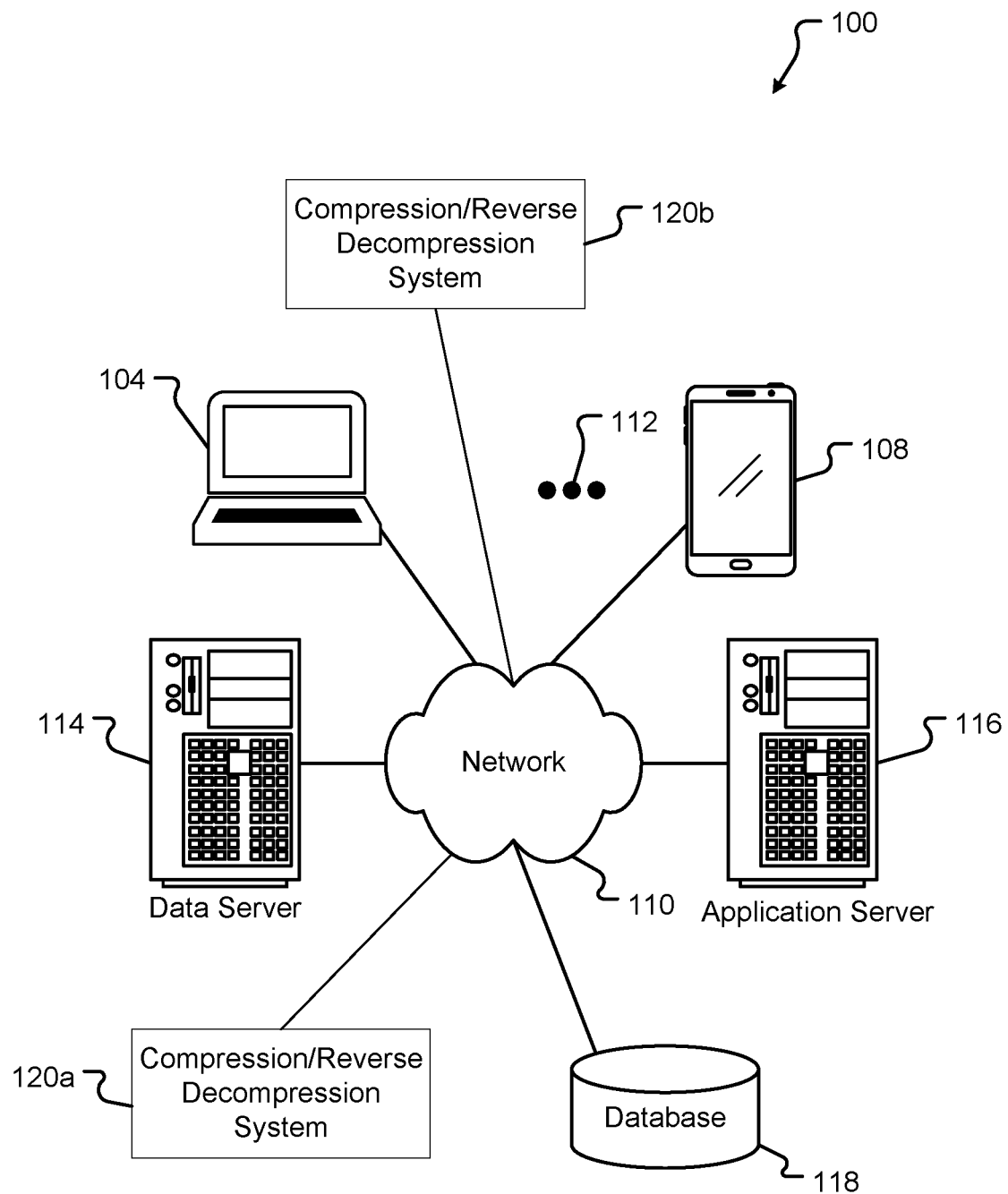
FIG. 1 is a block diagram illustrating elements of an exemplary computing environment in which embodiments of the present disclosure may be implemented.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

In the following description, for the purposes of explanation, numerous specific details are set forth in order to provide a thorough understanding of various embodiments disclosed herein. It will be apparent, however, to one skilled in the art that various embodiments of the present disclosure may be practiced without some of these specific details. The ensuing description provides exemplary embodiments only and is not intended to limit the scope or applicability of the disclosure. Furthermore, to avoid unnecessarily obscuring the present disclosure, the preceding description omits a number of known structures and devices. This omission is not to be construed as a limitation of the scopes of the claims. Rather, the ensuing description of the exemplary embodiments will provide those skilled in the art with an enabling description for implementing an exemplary embodiment. It should however be appreciated that the present disclosure may be practiced in a variety of ways beyond the specific detail set forth herein.

While the exemplary aspects, embodiments, and/or configurations illustrated herein show the various components of the system collocated, certain components of the system can be located remotely, at distant portions of a distributed network, such as a Local-Area Network (LAN) and/or Wide-Area Network (WAN) such as the Internet, or within a dedicated system. Thus, it should be appreciated, that the components of the system can be combined in to one or more devices or collocated on a particular node of a distributed network, such as an analog and/or digital telecommunications network, a packet-switch network, or a circuit-switched network. It will be appreciated from the following description, and for reasons of computational efficiency, that the components of the system can be arranged at any location within a distributed network of components without affecting the operation of the system.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising," "including," and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, Non-Volatile Random-Access Memory (NVRAM), or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a Compact Disk Read-Only Memory (CD-ROM), any other optical medium, punch cards, paper tape, any other physical medium with patterns of holes, a Random-Access Memory (RAM), a Programmable Read-Only Memory (PROM), and Erasable Programmable Read-Only Memory (EPROM), a Flash-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

A "computer readable signal" medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, Radio Frequency (RF), etc., or any suitable combination of the foregoing.

The terms "determine," "calculate," and "compute," and variations thereof, as used herein, are used interchangeably and include any type of methodology, process, mathematical operation or technique.

It shall be understood that the term "means" as used herein shah be given its broadest possible interpretation in accordance with 35 U.S.C. Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the disclosure, brief description of the drawings, detailed description, abstract, and claims themselves.

Aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Any combination of one or more computer readable medium(s) may be utilized. The computer readable medium may be a computer readable signal medium or a computer readable storage medium.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as Programmable Logic Device (PLD), Programmable Logic Array (PLA), Field Programmable Gate Array (FPGA), Programmable Array Logic (PAL), special purpose computer, any comparable means, or the like. In general, any device(s) or means capable of implementing the methodology illustrated herein can be used to implement the various aspects of this disclosure. Exemplary hardware that can be used for the disclosed embodiments, configurations, and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

Examples of the processors as described herein may include, but are not limited to, at least one of Qualcomm® Snapdragon® 800 and 801, Qualcomm® Snapdragon® 610 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX 4300, EA-6300, and FX-8350 32 nm Vishera, AMD® Kaveri processors, Texas Instruments® Jacinto C6000™ automotive infotainment processors, Texas instruments® OMAP™ automotive-grade mobile processors, ARM® Cortex™-M processors, ARM® Cortex-A and ARM926D-S™ processors, other industry-equivalent processors, and may perform computational functions using any known or future-developed standard, instruction set, libraries, and/or architecture.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or Very Large-Scale Integration (VLSI) design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or Common Gateway Interface (CGI) script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

Various additional details of embodiments of the present disclosure will be described below with reference to the figures. While the flowcharts will be discussed and illustrated in relation to a particular sequence of events, it should be appreciated that changes, additions, and omissions to this sequence can occur without materially affecting the operation of the disclosed embodiments, configuration, and aspects.

According to embodiments of the present disclosure, reverse decompression is disclosed. Reverse decompression requires decompressing input data of a file starting from the end of the file instead of starting from the beginning of the file and working backwards towards the beginning of the file. As discussed in greater detail below, with reverse decompression, the end of a file is known and thus where a block of a plurality of blocks of the input data ends is also known. Each block is traversed in a backwards or reverse direction until a position where the block could begin (e.g., a valid block type marker-header marker, valid data after this until the end of the valid data, and an end of block marker) is determined. The valid data or content is then parsed to potentially uncover backreferences to prior blocks.

If previous blocks (e.g., blocks towards the beginning of the input data) are needed to assist in decompressing the input data, an attempt is made to identify, the location of these previous blocks as it is known where the present block is located, and the previous blocks can be located in a similar manner. If at any point an inconsistency is discovered (e.g., valid data has been incorrectly assumed), the method backtracks to that decision point that led to the inconsistency and another path is taken. According to embodiments of the present disclosure, another path includes selecting a different content type that includes the valid data. The content type includes data having a literal string, data having a static dictionary and data having a dynamic dictionary. Each of these content types has a different format.

The benefits of reverse decompression include only decompressing data of the input data which is necessary for a user to obtain information about a file without having to decompress the entire file. This is beneficial when the most important information about a file is provided at the end of the file instead of at the beginning of the file. According to embodiments of the present disclosure, when file type detection is the main purposed for decompression of data, reverse decompression is beneficial. For example, when reading data at the beginning of a file indicates that data at or near the end of the file is required to obtain a positive match for file type detection, reverse decompression is beneficial since the entire file does not have to be decompressed for verification. As another example, when a document object model (e.g., the bit in the data input that indicates the location of literal strings) is provided at the end of the input data of a file and the initial text of a literal string is stored at the beginning of the file, reverse decompression along with conventional decompression techniques are used to decompress data. from the beginning of the file and the end of the file without decompressing the middle of the file. Again, reverse decompression is beneficial since the entire file does not have to be decompressed.

FIG. 1 is a block diagram illustrating elements of an exemplary computing environment in which embodiments of the present disclosure may be implemented. More specifically, this example illustrates a computing environment 100 that may function as the servers, user computers, or other systems provided and described herein. The environment 100 includes one or more user computers, or computing devices, such as a computing device 104, a communication device 108, and/or more other computing devices 112. The computing devices 104, 108, 112 may include general purpose personal computers (including, merely by way of example, personal computers, and/or laptop computers running various versions of Microsoft Corp.'s Windows® and/or Apple Corp.'s Macintosh® operating systems) and/or workstation computers running any of a variety of commercially available UNIX® or UNIX-like operating systems. These computing devices 104, 108, 112 may also have any of a variety of applications, including for example, database client and/or server applications, and web browser applications. Alternatively, the computing devices 104, 108, 112 may be any other electronic device, such as a thin-client computer, Internet-enabled mobile telephone, and/or personal digital assistant, capable of communicating via a network 110 and/or displaying and navigating web pages or other types of electronic documents. Although the exemplary computer environment 100 is shown with two computing devices, any number of user computers or computing devices may be supported.

The environment 100 further includes a network 110. The network 110 may can be any type of network familiar to those skilled in the art that can support data communications using any of a variety of commercially available protocols, including without limitation Session Initiation Protocol (SIP), Transmission Control Protocol/Internet Protocol (TCP/IP), Systems Network Architecture (SNA), Internetwork Packet Exchange (IPX), AppleTalk, and the like. Merely by way of example, the network 110 maybe a Local Area Network (LAN), such as an Ethernet network, a Token-Ring network and/or the like; a wide-area network; a virtual network, including without limitation a Virtual Private Network (VPN); the Internet; an intranet; an extranet; a Public Switched Telephone Network (PSTN); an infra-red network; a wireless network (e.g., a network operating under any of the IEEE 802.9 suite of protocols, the Bluetooth® protocol known in the art, and/or any other wireless protocol); and/or any combination of these and/or other networks.

The environment 100 also include one or more servers 114, 116. In this example, server 114 is shown as a data server and server 116 is shown as an application server. The data server 114, which may be used to process requests for web pages or other electronic documents from computing devices 104, 108, 112. The data server 114 can be running an operating system including any of those discussed above, as well as any commercially available server operating systems. The data server 114 can also run a variety of server applications, including SIP servers, HyperText Transfer Protocol (secure) (HTTP(s)) servers, FTP servers, CGI servers, database servers, Java servers, and the like. In some instances, the data server 114 may publish operations available operations as one or more web services.

The environment 100 may also include one or more file and or/application servers 116, which can, in addition to an operating system, include one or more applications accessible by a client running on one or more of the computing devices 104, 108, 112. The server(s) 116 and/or 114 may be one or more general purpose computers capable of executing programs or scripts in response to the computing devices 104, 108, 112. As one example, the server 116, 114 may execute one or more web applications. The web application may be implemented as one or more scripts or programs written in any programming language, such as Java™, C, C#®, or C++, and/or any scripting language, such as Perl, Python, or Tool Command Language (TCL), as well as combinations of any programming/scripting languages. The application server(s) 116 may also include database servers, including without limitation those commercially available from Oracle®, Microsoft®, Sybase®, IBM® and the like, which can process requests from database clients running on a computing device 104, 108, 112.

Web pages created by the server 114 and/or 116 may be forwarded to a computing device 104, 108, 112 via a web (file) server 114, 116. Similarly, the data server 114 may be able to receive web page requests, web services invocations, and/or input data from a computing device 104, 108, 112 (e.g., a user computer, etc.) and can forward the web page requests and/or input data to the web (application) server 116. In further embodiments, the server 116 may function as a file server. Although for ease of description, FIG. 1 illustrates a separate data server 114 and file/application server 116, those skilled in the art will recognize that the functions described with respect to servers 114, 116 may be performed by a single server and/or a plurality of specialized servers, depending on implementation-specific needs and parameters. The computer systems 104, 108, 112, web (data) server 114 and/or web (application) server 116 may function as the system, devices, or components described herein.

The environment 100 may also include a database 118. The database 118 may reside in a variety of locations. By way of example, database 118 may reside on a storage medium local to (and/or resident in) one or more of the computers 104, 108, 112, 114, 116. Alternatively, it may be remote from any or all of the computers 104, 108, 112, 114, 116, and in communication (e.g., via the network 110) with one or more of these. The database 118 may reside in a Storage-Area Network (SAN) familiar to those skilled in the art. Similarly, any necessary files for performing the functions attributed to the computers 104, 108, 112, 114, 116 may be stored locally on the respective computer and/or remotely, as appropriate. The database 118 may be a relational database, such as Oracle 20i®, that is adapted to store, update, and retrieve data in response to Structured Query Language (SQL) formatted commands.

The environment 100 may also include compression/reverse decompression systems 120a and 120b. As illustrated in FIG. 1, compression/reverse decompression systems 120a and 120b are provided as separate components, but according to an alternative embodiment of the present disclosure, the compression/reverse decompression systems 120a and 120b may be provided in two or more of the computers 104, 108, 112, 114, 116. According to one embodiment of the present disclosure, various scenarios are shown within environment 100. In a first scenario, the data server 114 contains data intended for use by computer 104. Data server 114 sends the data to the compression/reverse decompression system 120a. The compression/reverse decompression system 120a encodes and compresses the data prior to transmitting the encoded data to the network 110. The compression/reverse decompression system 120b receives the encoded data from the network 110. The compression/reverse decompression system 120b reverse decodes and decompresses the data and provides the data to the computer 104.

Conversely, in a second scenario, the computer 104 has data that is to be sent to the application server 116. The computer 104 sends the data to the compression/reverse decompression system 120b. The compression/reverse decompression system 120b encodes and compresses the data prior to it being sent to the network 110. The compression/reverse decompression system 120a receives the data from the network 110. The compression/reverse decompression system 120a reverse decodes and decompresses the data and provides the data to the application server 116.

Figure 2:
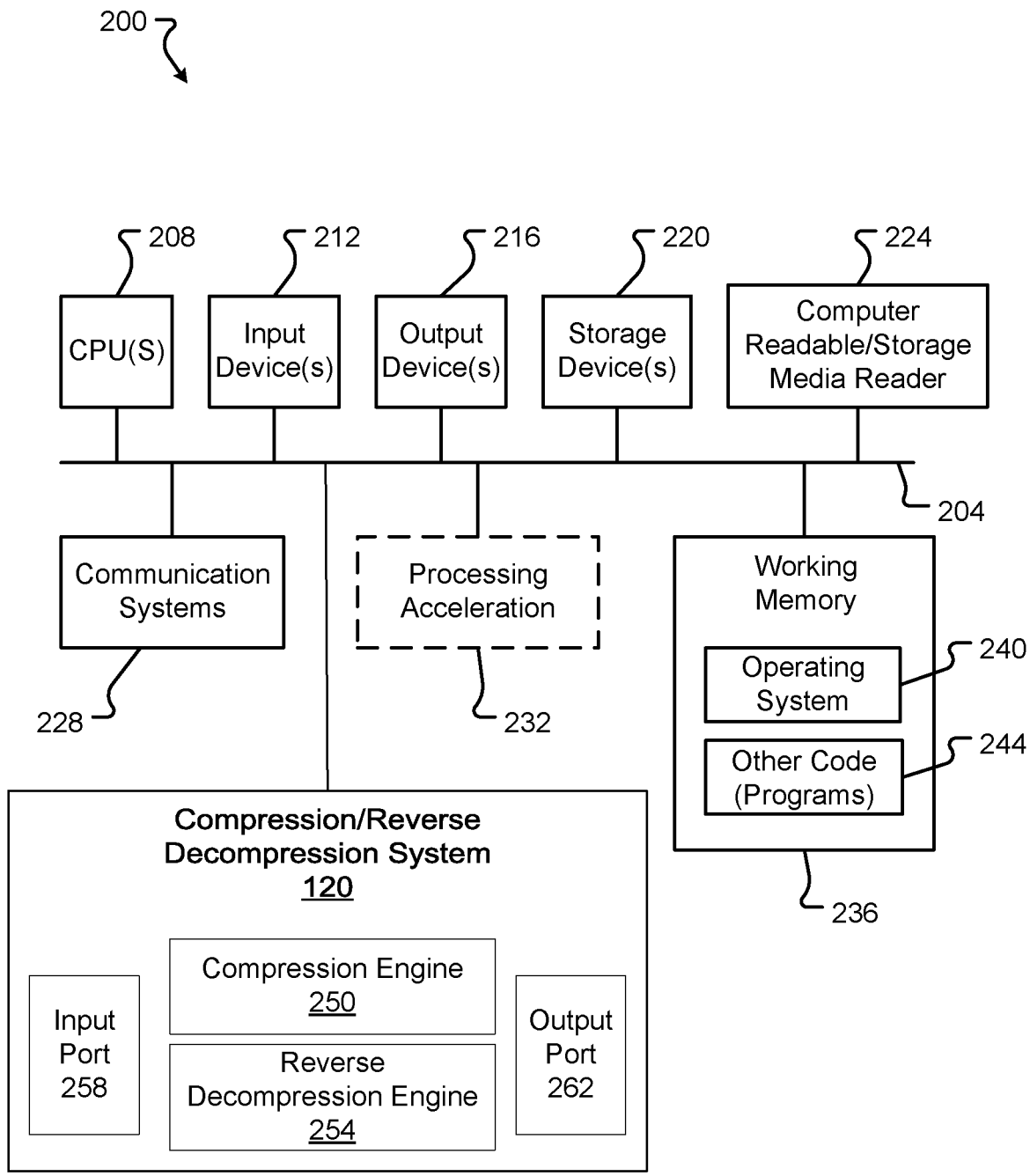
FIG. 2 is a block diagram illustrating elements of an exemplary computing device in which embodiments of the present disclosure may be implemented.

FIG. 2 is a block diagram illustrating elements of an exemplary computing device in which embodiments of the present disclosure may be implemented. More specifically, this example illustrates one embodiment of a computer system 200 upon which the servers, user computers, computing devices, or other systems or components described above may be deployed or executed. The computer system 200 is shown comprising hardware elements that may be electrically coupled via a bus 204. The hardware elements may include one or more Central Processing Units (CPUs) 208; one or more input devices 212 (e.g., a mouse, a keyboard, etc.); and one or more output devices 216 (e.g., a display device, a printer, etc.). The computer system 200 may also include one or more storage devices 220. By way of example, storage device(s) 220 may be disk drives, optical storage devices, solid-state storage devices such as a Random-Access Memory (RAM) and/or a Read-Only Memory (ROM), which can be programmable, flash-updateable and/or the like.

The computer system 200 may additionally include a computer-readable storage media. reader 224; a communications system 228 (e.g., a modem, a network card (wireless or wired), an infra-red communication device, etc.); and working memory 236, which may include RAM and ROM devices as described above. The computer system 200 may also include a processing acceleration unit 232, which can include a Digital Signal Processor (DSP), a special-purpose processor, and/or the like. The computer system 200 may further include a compression/reverse decompression system 120.

The computer-readable storage media reader 224 can further be connected to a computer-readable storage medium, together (and, optionally, in combination with storage device(s) 220) comprehensively representing remote, local, fixed, and/or removable storage devices plus storage media for temporarily and/or more permanently containing computer-readable information. The communications system 228 may permit data to be exchanged with a network and/or any other computer described above with respect to the computer environments described herein. Moreover, as disclosed herein, the term "storage medium" may represent one or more devices for storing data, including ROM, RAM, magnetic RAM, core memory, magnetic disk storage mediums, optical storage mediums, flash memory devices and/or other machine-readable mediums for storing information.

The computer system 200 may also comprise software elements, shown as being currently located within a working memory 236, including an operating system 240 and/or other code 244. It should be appreciated that alternate embodiments of a computer system 200 may have numerous variations from that described above. For example, customized hardware might also be used and/or particular elements might be implemented in hardware, software (including portable software, such as applets), or both. Further, connection to other computing devices such as network input/output devices may be employed.

Examples of the processors 208 as described herein may include, but are not limited to, at least one of Qualcomm® Snapdragon® 800 and 801, Qualcomm® Snapdragon® 620 and 615 with 4G LTE Integration and 64-bit computing, Apple® A7 processor with 64-bit architecture, Apple® M7 motion coprocessors, Samsung® Exynos® series, the Intel® Core™ family of processors, the Intel® Xeon® family of processors, the Intel® Atom™ family of processors, the Intel Itanium® family of processors, Intel® Core® i5-4670K and i7-4770K 22 nm Haswell, Intel® Core® i5-3570K 22 nm Ivy Bridge, the AMD® FX™ family of processors, AMD® FX-4300, FX-6300, and FX-8350 32 nm Vishera, AMD° Kaveri processors, Texas instruments® Jacinto C6000™ automotive infotainment processors, Texas Instruments® OMAP™ automotive-grade mobile processors, ARM® Cortex™-M processors, ARM® Cortex-A and ARM926EJ-S™ processors, other industry-equivalent processors, and may perform computational functions using any known or future-developed standard, instruction set, libraries, and/or architecture.

The compression/reverse decompression system 120 includes a compression engine 250, a reverse decompression engine 254, an input port 258, and an output port 262. According to an embodiment of the present disclosure, input data may be received by the input port 258. The input port 258 directs the input data, if in a raw uncompressed form, to the compression engine 250. Wherein if the input data is encoded and compressed input data, the input port 258 directs the encoded and compressed input data to the reverse decompression engine 254. In a scenario where the input data is aw input data, the input port 258 provides the raw input data to the compression engine 250. The compression engine 250 encodes and compresses the raw input data in accordance with the LZ-based protocols as discussed in greater detail below. The compression engine 250 outputs encoded and compressed input data to the output port 262 which is presented as encoded and compressed output data.

In a scenario where encoded and compressed input data is received as the input data, the input port 258 receives encoded and compressed input data and provides it to the reverse decompression engine 254. The reverse decompression engine 254 decodes and decompresses the encoded and compressed input data according to the LZ-based protocols in a reverse manner. The reverse decompression engine 254 first tries to identify valid blocks (e.g., blocks the fit a particular format based on the LZ-based protocols) from the encoded and compressed input data starting from the end of the input data. After successful identification of valid block(s), the reverse decompression engine 254 decodes and decompresses the encoded and compressed input data starting from the beginning of the identified valid block into a decoded and decompressed input data and provides it to the output port 262 which is outputted as output data.

Figure 3:
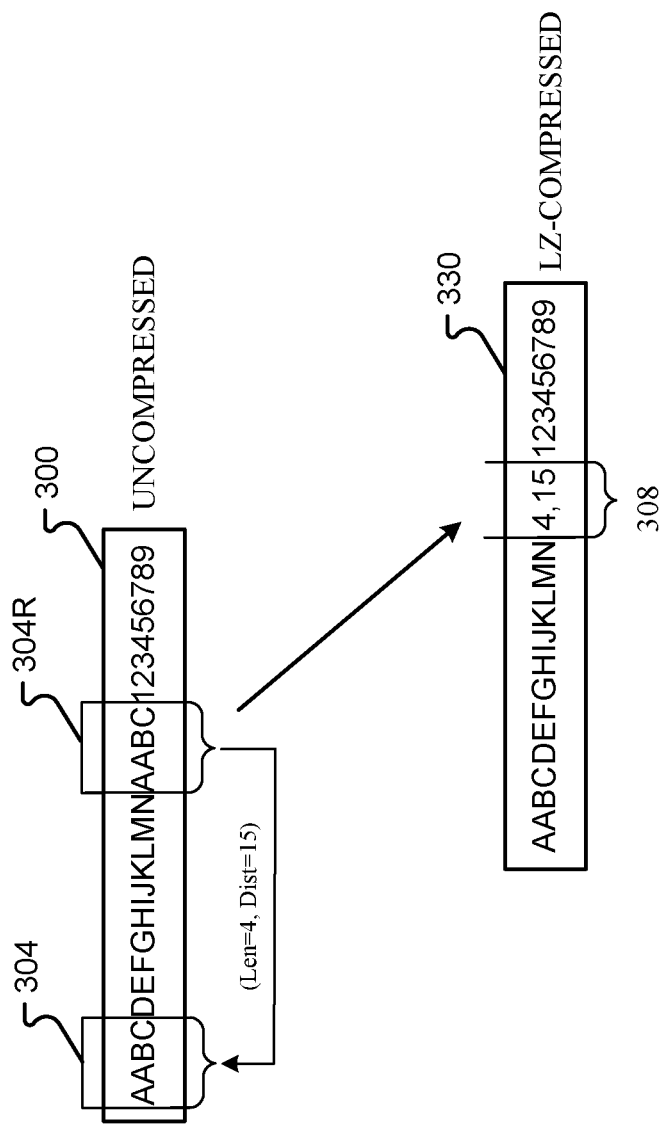
FIG. 3 is a block diagram illustrating an exemplary uncompressed data block and an exemplary compressed data block after being compressed using Lempel-Ziv (LZ)-based data compression according to an embodiment of the present disclosure.

FIG. 3 is a block diagram illustrating an exemplary uncompressed data block 300 and an exemplary compressed data block 330 after being compressed using Lempel-ZIV (LZ)-based data compression according to an embodiment of the present disclosure. As illustrated in FIG. 3, the LZ-based compression captures a repeated data pattern 304R (e.g., AABC) of data 304 in the input data block 300 to be compressed. The captured repeated data pattern 304R in the input data block 300 is reduced to a reduced size length and distance block 308 (e.g., [4, 15]) from the current point that the repeated data pattern 304R appeared elsewhere in the input data block 300. In this manner, when the output data block 330 is decompressed, the length and distance block 308 can be replaced with the true pattern (e.g., AABC) at the distance and length in the output data block 330 to recreate the uncompressed input data block 300.

Figure 4:
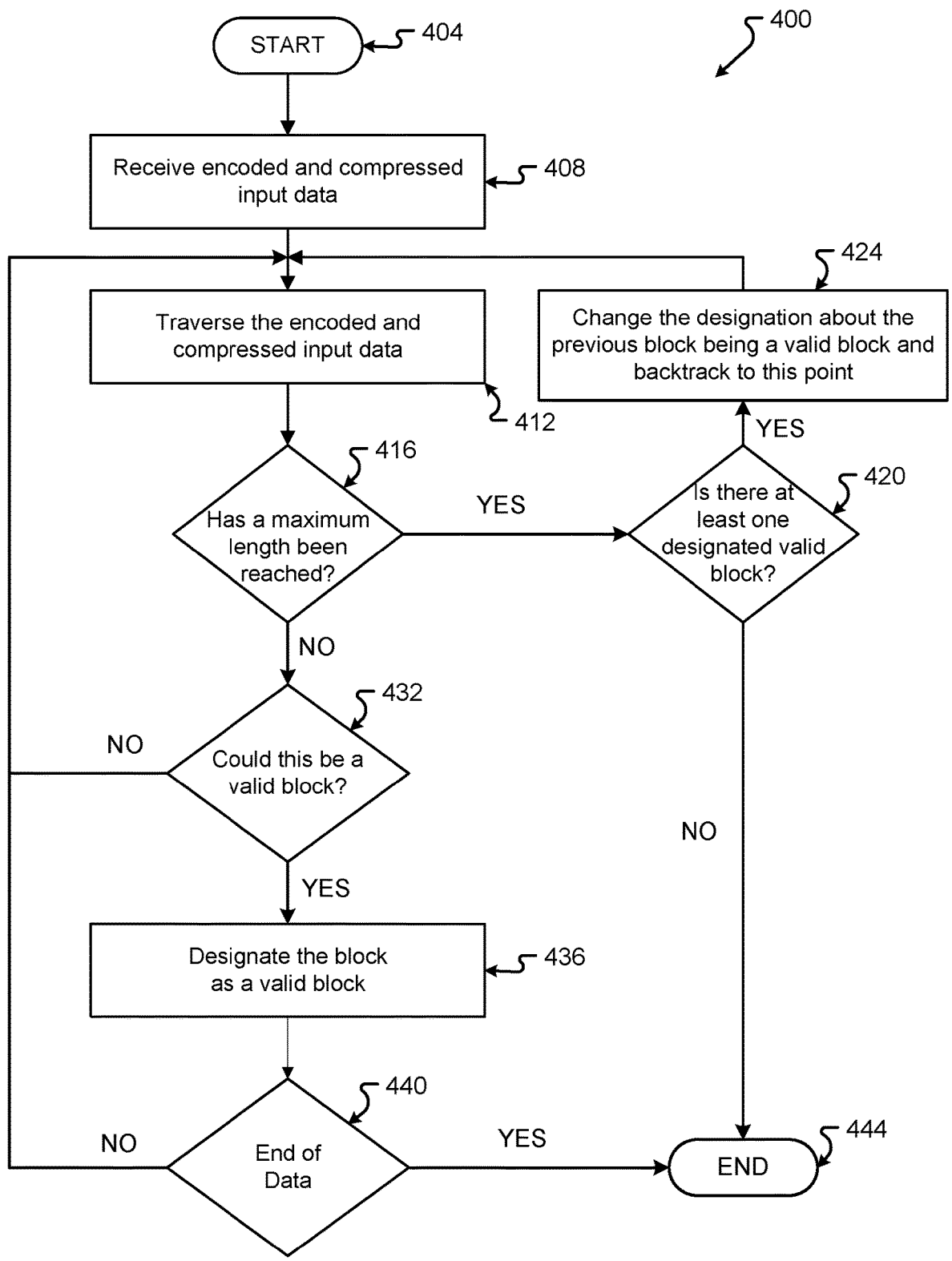
FIG. 4 represents a flowchart illustrating a method for reverse decompression according to an embodiment of the present disclosure.

FIG. 4 represent a flow diagram of a method 400 for reverse decompression according to an embodiment of the present disclosure. While a general order of the steps of method 400 is shown in FIG. 4, method 400 can include more or fewer steps or can arrange the order of the steps differently than those shown in FIG. 4. Further, two or more steps may be combined into one step. Generally, method 400 starts with a START operation at step 404 and ends with an END operation at step 444. Method 400 can be executed as a set of computer-executable instructions executed by a data-processing system and encoded or stored on a computer readable medium. Hereinafter, method 400 shall be explained with reference to systems, components, modules, software, data structures, user interfaces, etc. described in conjunction with FIGS. 1 and 2.

Method 400 may begin at step 404 and proceed to step 408, where the reverse decompression engine 254 and the processor 208 receives encoded and compressed input data. According to one embodiment of the present disclosure, the encoded and compressed input data is in the form of transmitted encoded and compressed input data. According to an alternative embodiment of the present disclosure, the encoded and compressed input data is in the form of stored encoded and compressed input data. As illustrated in FIGS. 5A-5C, the encoded and compressed input data 500a-500c include blocks 504a-504c, respectively. Although only one block is illustrated for each of the input data 500a-500c, more than one block may be included in each of the input data 500a-500c without departing from the spirit and scope of the present disclosure. Each block 504a-504c includes a header marker 508a-508c, content 512a-512c and an end of block marker 516a-516c, respectively. According to one embodiment of the present disclosure, the header markers 508a-508c represent the compression type for the content 512a-512c for each of the blocks 540a-540c and includes two bits. For example, when the content 512a includes a compressed literal string, the header marker is represented by the bits "00". When the content 512b is compressed using static Huffman tables, the header marker is represented by the bits "01". Furthermore, when the content 512c is compressed using dynamic Huffman tables, the header marker is presented by the bits "10". As illustrated in FIGS. 5A-5C, header marker 508a indicates the content includes a literal string, header marker 508b indicates the content is compressed using static Huffman tables, and header marker 508c indicates the content is compressed using dynamic Huffman tables.

Figure 6A:
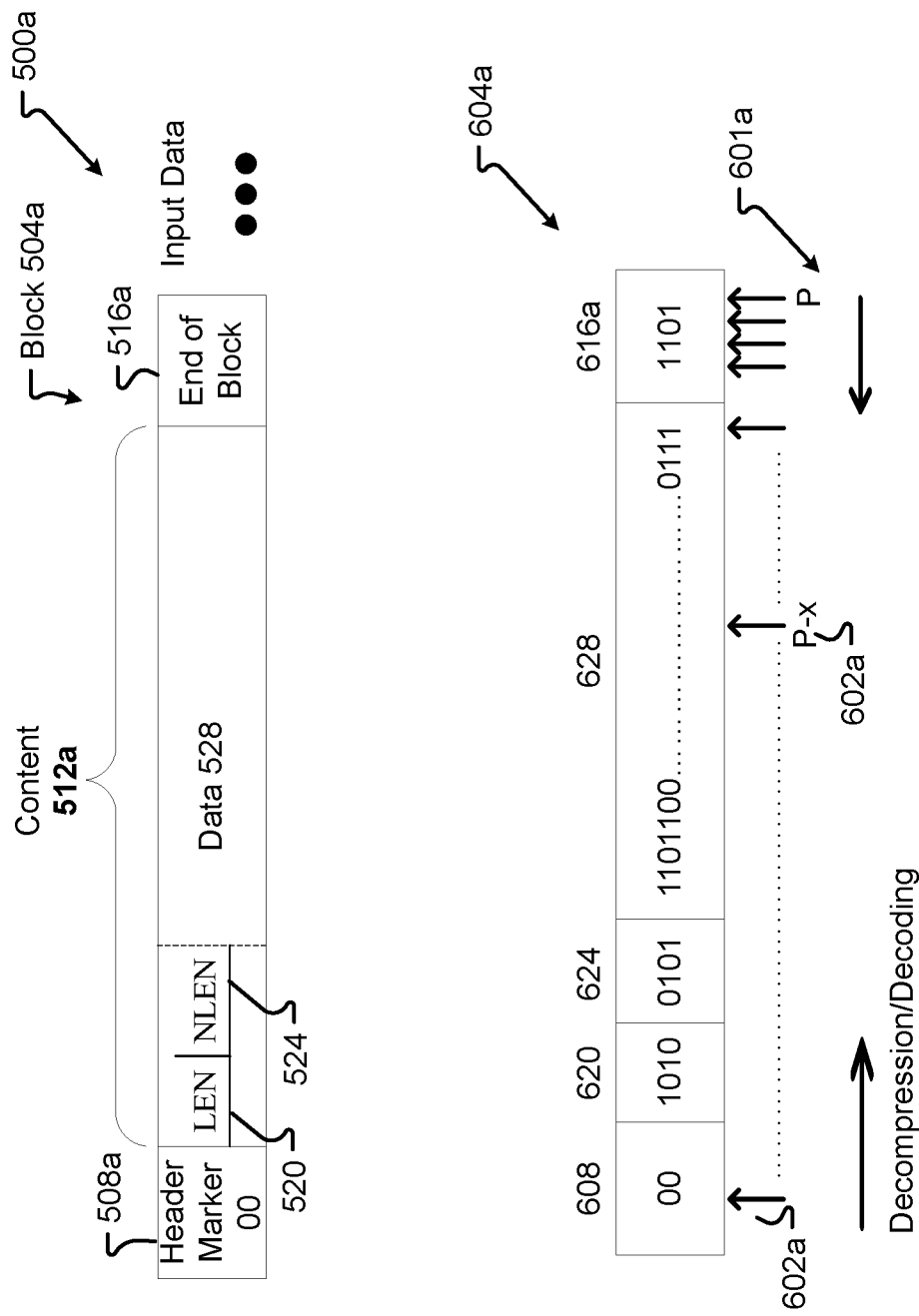
FIGS. 6A-6C are block diagrams illustrating input data being decompressed and decoded according to embodiments of the present disclosure.
Figure 6B:
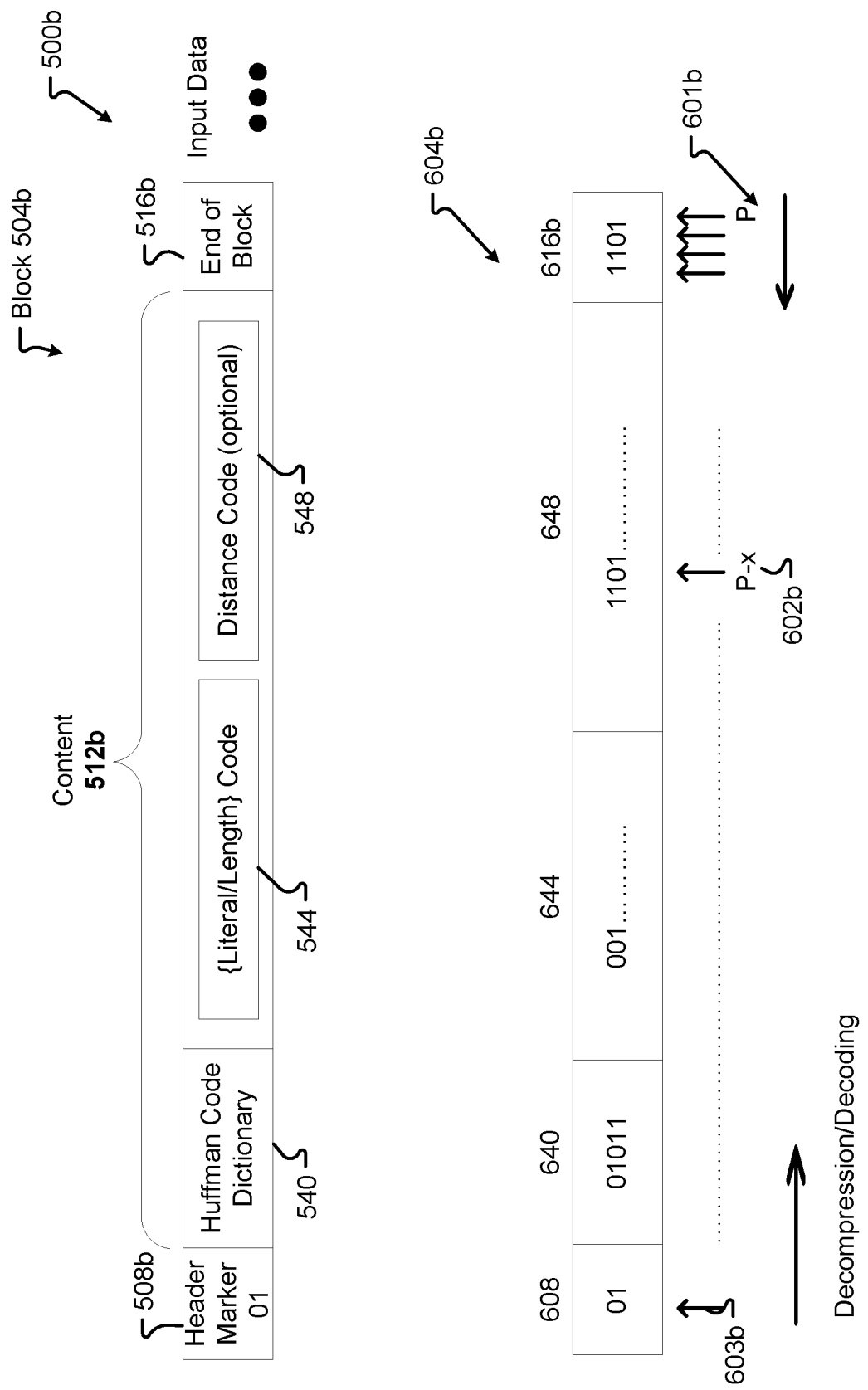
Figure 6C:
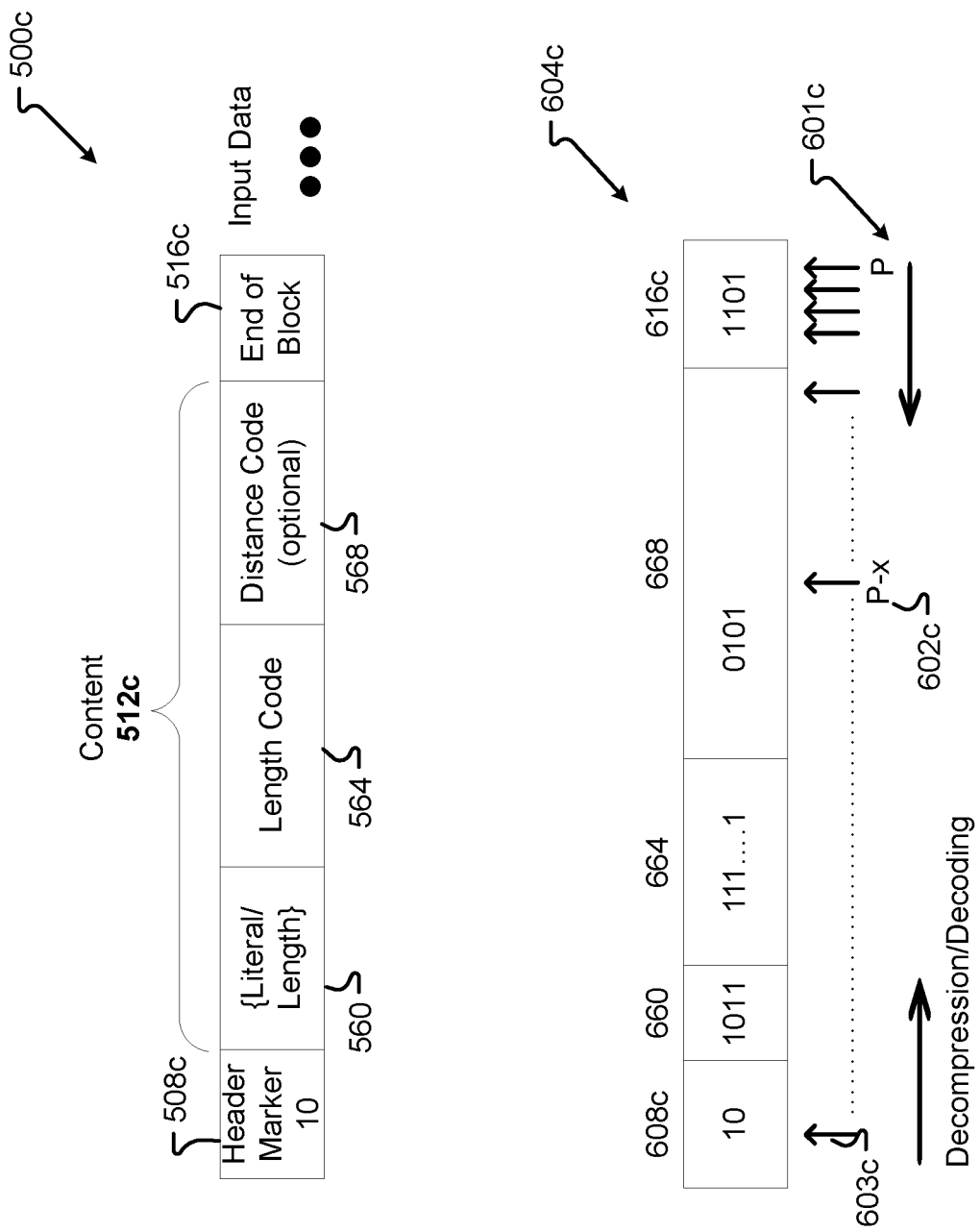

Referring back to FIG. 4, after receiving the encoded and compressed input data at step 408, method 400 proceeds to step 412, where the reverse decompression engine 254 and processor 208 traverse encoded and compressed the input data, bit by bit, in a reverse direction starting from a last bit of the end of block marker of the last block of the input data towards the beginning of the input data. This end of block marker identifies the end of the data for each of the blocks. According to one embodiment of the present disclosure, when the encoded and compressed input data is initially sent, the last bit of the end of block marker is easily identified since this is the last bit of data for a block of data. At all other times, it may be assumed that the reverse decompression engine 254 and processor 208 are at the end of block marker. According to embodiments of the present disclosure as illustrated in FIGS. 6A-6C, the end of block markers 616a-616c include four bits. For example purposes only, the four bits is represented by the bits "1101." Although a four-bit marker is illustrated, an end of block marker having more or less than four bits or an end of block marker being different for each type of block 604a-604c can be used without departing from the spirit and scope of the present disclosure.

According to embodiments of the present disclosure as illustrated in FIGS. 6A-6C, the letter "P" (at locations 601a-601c) indicates the last bit for each of the blocks 604a-604c. The reverse decompression engine 254 and the processor 208 shift the input data one bit to the left as indicated by the arrow 650a-650c. For example, the blocks 604a-604c are traversed to the left moving from bit "1" to bit "0." According to embodiments of the present disclosure, the blocks 604a-604c are traversed to the left, bit by bit, in an attempt to identify a valid block.

After traversing the end of blocks 516a-516c, the reverse decompression engine 254 and the processor 208, proceed to the next portion of the input data for each block 504a-504c which includes the content 512a-512c. Referring back to FIGS. 5A-5C, the type of content can include one of a literal string, compressed data from a static dictionary and compressed data from a dynamic dictionary and each of these types of content has a different content format as discussed below. For example, as illustrated in FIG. 5A, the type of content represented by the literal string includes length information and data information. The length information includes the length (LEN) 520 of the uncompressed data 528, followed by the 1's complement of the length (NLEN) 524. The data information includes the data 528.

As illustrated in FIG. 5B, the type of content represented by compressed data from a static dictionary includes a Huffman code dictionary 540 (this is for optimal Huffman encoding only), a repeating data block which includes a literal length code 544 and an optional distance code 548). The first repeating symbol in the repeating data block is a literal or length code. If a literal is present, the repeating data block can be followed with another repeating data block. If a length code is present, the length code is followed by the optional distance code 548. According to an alternative embodiment of the present disclosure, the type of content represented by compressed data from a static dictionary simply includes the compressed data since the static Huffman tables are known in advance. Therefore, immediately following the header marker 508b, is the compressed data itself.

As illustrated in FIG. 5C, the type of content represented by compressed data from a dynamic dictionary includes a plurality of repeating data blocks that include literal/distance code 560, length code 564 and optional distance code 568 which are 9-bit, 2-bit to infinite-bit, and 9-bit to 13-bit, respectively. According to an alternative embodiment of the present disclosure, the repeating data block includes either the literal code 560 or a distance code 568 followed by the length code 564 that may be repeating. According to a further alternative embodiment of the present disclosure, information for recreating the dynamic Huffman tables is compressed and then embedded into the content itself. Accordingly, before decompression of the actual data can commence, the information for creating the dynamic Huffman tables is decompressed and used. to establish the dynamic Huffman tables used to decompress the remainder of the content that contains the actual data. In order to recreate the dynamic Huffman tables used to decode the data, a couple of well-known rules are followed. The length of each code used to encode a character or element of the uncompressed dataset is included in the compressed dataset. This length value is referred to as a "codelength." Since dynamic Huffman coding compresses the information for creating the dynamic Huffman tables, which in turn contains the information for decompressing the dataset itself, a number of Huffman code information fields are embedded at the beginning of the content. These fields are discussed below. The Huffman code information is immediately followed by the actual data which is followed by the end of block marker 516c.

In the case of dynamic Huffman coding, the following information is included within the content immediately following the header marker 508c. HLIT indicating the number of length/literal codes less 257; HDIST indicating the number of distance codes less one; HCLEN indicating the number of codelength codes less four (for creating the codelength Huffman table); CLENC indicating the code lengths for each codelength alphabet (of the codelength Huffman table); CLENLL indicating the code lengths for the length/literal alphabet of the Length/Literal Huffman table; CLEND indicating the code lengths for the distance alphabet of the Distance Huffman table. Again it is restated, because the dynamic Huffman encoding compresses the information for creating the dynamic Huffman tables, which in turn are used to decode the actual data, the HCLEN and CLENC: fields contain information for creating the codelength Huffman table, while the CLENLL and CLEND fields contain information for creating the length/literals Huffman table and the Distance Huffman table.

Referring back to FIG. 4, after traversing the input data, bit by bit, in a reverse direction starting from a last bit of the end of block marker of the last block of the input data towards a beginning of the input at step 412, method 400 proceeds to decision step 416 where the reverse decompression engine 254 and the processor 208 determine if a maximum length has been reached. If a maximum length has not been reached (NO) at decision step 420, method 400 proceeds to decision step 432 where the reverse decompression engine 254 and the processor 208 determine if the block could be a valid block. According to embodiments of the present disclosure, maximum lengths are determined for each of the blocks 504a-504c. These maximum lengths can be the same length, or these lengths can be different lengths.

A block is determined to be a valid block if the block has the correct format and the correct length as discussed in greater detail below. If the block could not be a valid block (NO) at decision step 432, method 400 returns to step 412 where the reverse decompression engine 254 and the processor 208 traverse the input data. If the block could be a valid block (YES) at decision step 432, the reverse decompression engine 254 and the processor 208 proceed to step 436 where the block is designated as a valid block. Designating the block as a valid block does not mean the block is actually a valid block. Designating the block as a valid block means that by traversing the block in the reverse direction, the block has the correct format and the correct length to potentially be a valid block.

For example, referring back to FIG. 6A, block 604a could be considered to be a valid block after traversing the block in the reverse direction and reaching location 603a. At location 603a, the header marker could be determined to decode the type of content. Also, the value for the length and the complement to the length can be determined. With this information the length of the data could be determined as well as the end of block information. At this point, the block could be decompressed and decoded to determine if the assumptions about the block are correct. On the other hand, if block 604a is only traversed in the reverse direction up to location 602a (location P-x), an assumption that this is a valid block up to location 602a would be incorrect if the header marker indicating the type of content and the other parameters within the content (LEN, NLEN and Data) are not in the correct format and do not have the correct length.

After designating the block as a valid block at step 436, method 400 proceeds to decision step 440 where the reverse decompression engine 254 and the processor 208 determine if this is the end of data. If this is the end of data (YES) at decision step 440, method 400 ends at END operation 444. If this is not the end of the data (NO) at decision block 440, method 400 returns to step 412 where the reverse decompression engine 254 and the processor 208 method 400 returns to step 412 where the reverse decompression engine 254 and the processor 208 traverse the input data.

If a maximum length has been reached (YES) at decision step 416, method 400 proceeds to decision step 420 where the reverse decompression engine 254 and the processor 208 determine if there is at least one designated valid block. According to one embodiment of the present disclosure, the determination of at least one designated valid block indicates the one of the previous blocks has been correctly designated as a valid block. According to embodiments of the present disclosure, this determination can be made by decoding and decompressing the previous block(s). If there is not at least one designated valid block (NO) at decision step 420, method 400 ends at END operation 444. If there is at least one designated valid block (YES) at decision step 420, method 400 proceeds to step 424 where the reverse decompression engine 254 and the processor 208 change the designation about the previous block being a valid block and backtrack to this point. After changing the designation about the previous block being a valid block and backtracking to this point at step 424, method 400 returns to step 412 where the reverse decompression engine 254 and the processor 208 traverse the input data.

The present disclosure, in various aspects, embodiments, and/or configurations, includes components, methods, processes, systems, and/or apparatus substantially as depicted and described herein, including various aspects, embodiments, configurations embodiments, sub-combinations, and/or subsets thereof. Those of skill in the art will understand how to make and use the disclosed. aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration. and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method for reverse decompression, comprising:

receiving, by a processor, encoded and compressed input data in a form of one or more data blocks;

locating, by the processor, an end of block marker for a last block of the one or more data blocks of the compressed input data;

traversing, by the processor, the compressed input data, bit by bit, in a reverse direction starting from a last bit of the end of block marker of the last block of the one or more data blocks of the compressed input data towards a beginning of the compressed input data;

determining, by the processor, if one block of the one or more blocks of the compressed input data can be designated as a valid block based on a known format for content and a corresponding length of the known format for the content;

designating, by the processor, the one block as a valid block; and decompressing, by the processor, the valid block in a forward direction wherein the end of block marker is based on a type of the content of the compressed input data.

2. The method for reverse decompression according to claim 1, further comprising:
    determining, by the processor, that a maximum data block length has been reached after traversing, bit by bit, at least one of the one or more data blocks of the compressed input data;
    determining, by the processor, if there is at least one prior designated valid block; and
    if there is at least one prior designated valid block, changing, by the processor, a designation about a previous block being a valid block,
    wherein the previous block is provided before the at least one prior designated valid block in the forward direction.

3. The method for reverse decompression according to claim 1, further comprising:
    determining, by the processor, that a maximum data block length has been reached after traversing the input data bit by bit;
    determining, by the processor, if there is at least one prior designated valid block; and
    if there is not at least one prior designated valid block, terminating, by the processor, the method for reverse decompression.

4. The method for reverse decompression according to claim 1, wherein if one block of the one or more blocks of the input data cannot be designated as a valid block, continuing to traverse, by the processor, the compressed input data, bit by bit, in the reverse direction towards the beginning of the compressed input data.

5. The method for reverse decompression according to claim 1, wherein the one or more data blocks includes a literal string.

6. The method for reverse decompression according to claim 1, wherein the one or more data blocks includes a static dictionary for decompressing data compressed using static Huffman tables.

7. The method for reverse decompression according to claim 1, wherein the one or more data blocks includes a dynamic dictionary for decompressing data compressed using dynamic Huffman tables.

8. The method for reverse decompression according to claim 1, wherein the reverse decompression is operative in accordance with a Lempel-Ziv type algorithm.

9. A system, comprising:
    a processor; and
    a memory coupled with and readable by the processor and storing therein a set of instructions which, when executed by the processor, causes the processor to reverse decompress encoded and compressed input data by:
        receiving encoded and compressed input data in a form of one or more data blocks;
        locating an end of block marker for a last block of the one or more data blocks of the compressed input data;
        traversing the compressed input data, bit by bit, in a reverse direction starting from a last bit of the end of block marker of the last block of the one or more data blocks of the compressed input data towards a beginning of the compressed input data;
        determining if one block of the one or more blocks of the compressed input data can be designated as a valid block based on a known format for content and a corresponding length of the known format for the content;
        designating the one block as a valid block; and
        decompressing the valid block in a forward direction,
        wherein the end of block marker is based on a type of the content of the compressed input data.

10. The system according to claim 9, further comprising:
    determining that a maximum data block length has been reached after traversing, bit by bit, at least one of the one or more data blocks of the compressed input data;
    determining if there is at least one prior designated valid block; and
    if there is at least one prior designated valid block, changing a designation about a previous block being a valid block,
    wherein the previous block is provided before the at least one prior designated valid block in the forward direction.

11. The system according to claim 9, further comprising:
    determining that a maximum data block length has been reached after traversing the input data bit by bit;
    determining if there is at least one prior designated valid block; and
    if there is not at least one prior designated valid block, terminating the reverse decompression of the encoded and compressed input data.

12. The system according to claim 9, wherein if one block of the one or more blocks of the input data cannot be designated as a valid block, continuing to traverse, by the processor, the compressed input data, bit by bit, in the reverse direction towards the beginning of the compressed input data.

13. The system according to claim 9, wherein the one or more data blocks includes a literal string.

14. The system according to claim 9, wherein the one or more data blocks includes a static dictionary for decompressing data compressed using static Huffman tables.

15. The system according to claim 9, wherein the one or more data blocks includes a dynamic dictionary for decompressing data compressed using dynamic Huffman tables.

16. The system according to claim 9, wherein the reverse decompression is operative in accordance with a Lempel-Ziv type algorithm.

17. A non-transitory, computer-readable medium comprising a set of instructions stored therein which, when executed by a processor, causes the processor to reverse decompress an encoded and compressed input data by:
    receiving encoded and compressed input data in a form of one or more data blocks;
    locating an end of block marker for a last block of the one or more data blocks of the compressed input data;
    traversing the compressed input data, bit by bit, in a reverse direction starting from a last bit of the end of block marker of the last block of the one or more data blocks of the compressed input data towards a beginning of the compressed input data;
    determining if one block of the one or more blocks of the compressed input data can be designated as a valid block based on a known format for content and a corresponding length of the known format for the content;
    designating the one block as a valid block; and
    decompressing the valid block in a forward direction,
    wherein the end of block marker is based on a type of the content of the compressed input data.

18. The non-transitory, computer-readable medium according to claim 17, further comprising:
- determining that a maximum data block length has been reached after traversing, bit by bit, at least one of the one or more data blocks of the compressed input data;
- determining if there is at least one prior designated valid block; and
- if there is at least one prior designated valid block, changing a designation about a previous block being a valid block,
- wherein the previous block is provided before that at least one prior designated valid block in the forward direction.

19. The non-transitory, computer-readable medium according to claim 17, further comprising:
- determining, by the processor, that a maximum data block length has been reached after traversing the input data bit by bit;
- determining, by the processor, if there is at least one prior designated valid block; and
- if there is not at least one prior designated valid block, terminating, by the processor, the reverse decompression.

20. The non-transitory, computer-readable medium according to claim 17, wherein if one block of the one or more blocks of the input data cannot be designated as a valid block, continuing to traverse, by the processor, the compressed input data, bit by bit, in the reverse direction towards the beginning of the compressed input data.

* * * * *